(12) United States Patent
Hsu (10) Patent No.: US 11,985,435 B2
(45) Date of Patent: May 14, 2024

(54) COMPACT CAMERA INCORPORATING MICROLENS ARRAYS FOR ULTRA-SHORT DISTANCE IMAGING

(71) Applicant: OmniVision Technologies, Inc., Santa Clara, CA (US)

(72) Inventor: Shih-Hsin Hsu, Taipei (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 108 days.

(21) Appl. No.: 17/835,790

(22) Filed: Jun. 8, 2022

(65) Prior Publication Data
US 2023/0403478 A1 Dec. 14, 2023

(51) Int. Cl.
*H04N 25/131* (2023.01)
*H04N 23/45* (2023.01)
*H04N 23/80* (2023.01)

(52) U.S. Cl.
CPC .......... *H04N 25/131* (2023.01); *H04N 23/45* (2023.01); *H04N 23/80* (2023.01)

(58) Field of Classification Search
CPC ....... H04N 25/131; H04N 23/45; H04N 23/80
See application file for complete search history.

(56) References Cited

U.S. PATENT DOCUMENTS

| | | | |
|---|---|---|---|
| 5,479,049 A * | 12/1995 | Aoki | H01L 27/14627 257/233 |
| 5,696,371 A | 12/1997 | Meyers | |
| 6,057,538 A | 5/2000 | Clarke | |
| 6,381,072 B1 | 4/2002 | Burger | |
| 6,958,862 B1 | 10/2005 | Joseph | |
| 2010/0009493 A1* | 1/2010 | Kim | H01L 27/14621 257/E31.127 |
| 2010/0060746 A9* | 3/2010 | Olsen | H04N 25/41 348/222.1 |
| 2011/0221947 A1* | 9/2011 | Awazu | G02B 3/0043 348/311 |
| 2016/0306159 A1* | 10/2016 | Schnitzler | G06T 5/50 |
| 2021/0193727 A1* | 6/2021 | Asatsuma | H01L 27/1464 |

* cited by examiner

*Primary Examiner* — Hung H Lam
(74) *Attorney, Agent, or Firm* — COZEN O'CONNOR (57) ABSTRACT

A compact camera includes an image sensor, a transparent layer, and a microlens (ML) layer, between the image sensor and the transparent layer. The ML layer forms (a) a first ML array having a plurality of first MLs, and (b) a second ML array with a plurality of second MLs interleaved with the plurality of first MLs. The compact camera also includes a baffle layer, between the ML layer and the image sensor, that forms a plurality of first aperture stops each aligned with a different one of the first MLs and a plurality of second aperture stops each aligned with a different one of the second MLs. The first MLs each have a first set of optical characteristics and the second MLs each have a second set of optical characteristics that are different from the first set of optical characteristics.

20 Claims, 12 Drawing Sheets

COMPACT CAMERA INCORPORATING MICROLENS ARRAYS FOR ULTRA-SHORT DISTANCE IMAGING

BACKGROUND

Compact and low-profile cameras are key components in today's smartphones, tablets, laptops, gaming controllers, and a variety of portable devices that need an embedded camera or cameras. Applications where the imaged object is at a distance of two millimeters or less include biometric authentication (e.g., fingerprint, heart rate, or vein recognition) and label and/or barcode reading, and therefore ultra-short distance imaging is required.

Figure 1A:
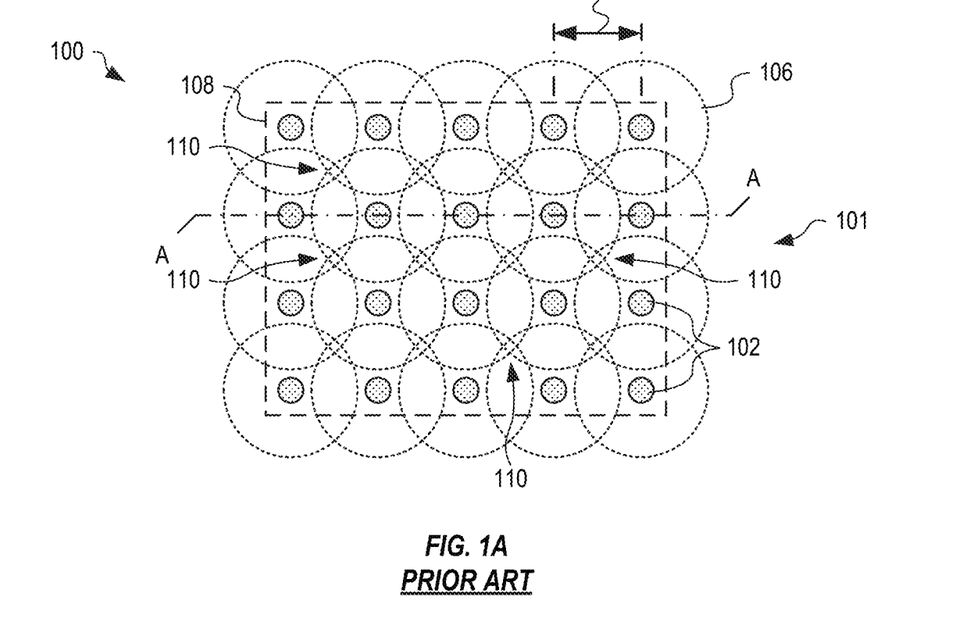
FIGS. 1A and 1B show a prior art camera that is made compact and low-profile by use of an array of microlenses (MLs).
Figure 1B:
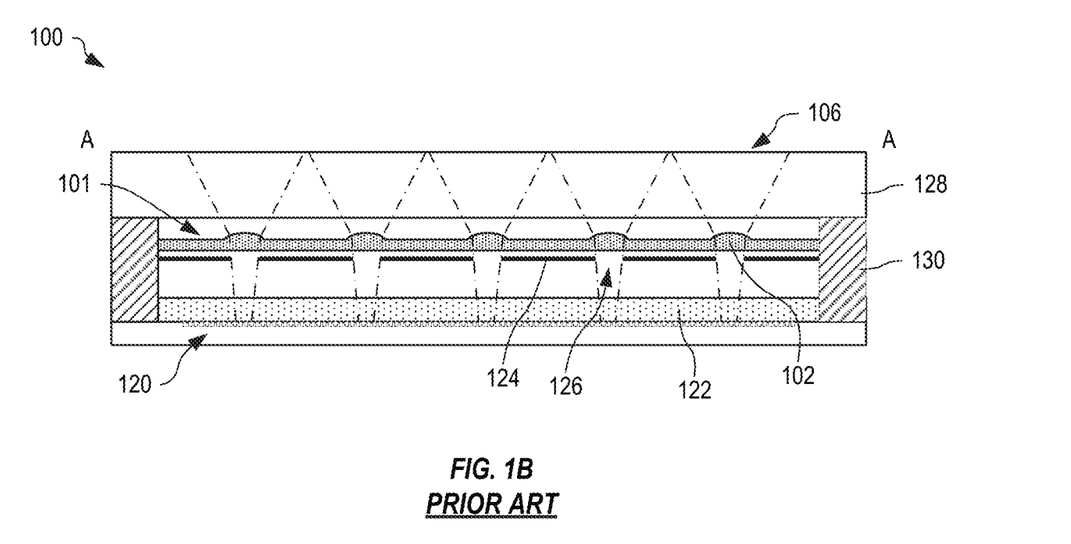

Ultra-short distance imaging is challenging for conventional cameras employing a single lens or a single group of lenses that cover the full field of view (FOV), particularly when the total length of the module is below two millimeters, a requirement of most smartphones and handheld devices. Besides, a larger lens usually has poorer image quality near the edge of its FOV. FIGS. 1A and 1B show one example prior art camera 100 that is made compact and low-profile by using an array 101 of microlenses (MLs) 102 (also called lenslet array) and a pitch 104. FIG. 1A is a top schematic illustrating array 101 of MLs 102, and FIG. 1B shows a cross-section A-A through camera 100 of FIG. 1A. As shown in FIG. 1B, camera 100 also includes a filter 122, a baffle layer 124 with a plurality of aperture stops 126, each positioned relative to each ML 102, a glass cover 128, and support structure 130.

Each ML 102 acquires only a partial FOV 106 onto a region of an image sensor 120 and software stitches each of the captured image regions together to form the whole image that represents a full FOV 108 (illustratively shown in dashed outline). Since each ML's partial FOV 106 only covers a part of the full FOV 108, its focal length as well as the total module length is reduced.

In prior art cameras, array 101 is a regular pattern (e.g., square of pitch 104) of identical MLs 102, where each ML 102 individually images a circular FOV 106 (or its inscribed square) that overlaps with other MLs' FOVs. In general, the image quality (including MTF and distortion) and brightness degrades gradually from the center of a lens' FOV to the boundary, and therefore certain portions (e.g., portions 110) of the full FOV 108, especially near the boundary of individual FOVs 106, is not covered efficiently by ML array 101. Accordingly, the image quality and brightness varies substantially at different locations across the full FOV 108. That is, within each ML partial FOV 106, the image quality and brightness degrade gradually from the center of FOV 106 to the boundary, and since FOVs 106 overlap only at the boundary, portions 110 of the full FOV 108 at the overlapping boundaries of individual FOVs 106 are not covered efficiently by array 101 of MLs 102 and the resultant image of the full FOV 108 is not optimal.

SUMMARY

In one embodiment, a compact camera for ultra-short distance imaging includes an image sensor, a transparent layer, a microlens (ML) layer, and a baffle layer. The ML layer is between the image sensor and the transparent layer, forming (a) a first ML array having a plurality of first MLs, and (b) a second ML array with a plurality of second MLs interleaved with the plurality of first MLs. The baffle layer is between the ML layer and the image sensor and forms a plurality of first aperture stops each aligned with a different one of the first MLs and a plurality of second aperture stops each aligned with a different one of the second MLs. The first MLs each have a first set of optical characteristics and the second MLs each have a second set of optical characteristics, different from the first set of optical characteristics.

In another embodiment, a method for ultra-short distance imaging includes forming, at each of a plurality of first regions of image sensor, a respective one of a plurality of first images, and forming, at each of a plurality of second regions of an image sensor, a respective one of a plurality of second images. The plurality of first images and the plurality of second images are captured using the image sensor and the plurality of captured first images and the plurality of captured second images are stitched together to form a whole image.

DETAILED DESCRIPTION OF THE EMBODIMENTS

Embodiments of cameras disclosed herein solve the issue of non-uniformity in image quality and brightness by incorporating two interlaced ML arrays. Each ML array has different characteristics, such as one or more of: size, shape, field-of-view (FOV), and so on.

Figure 2:
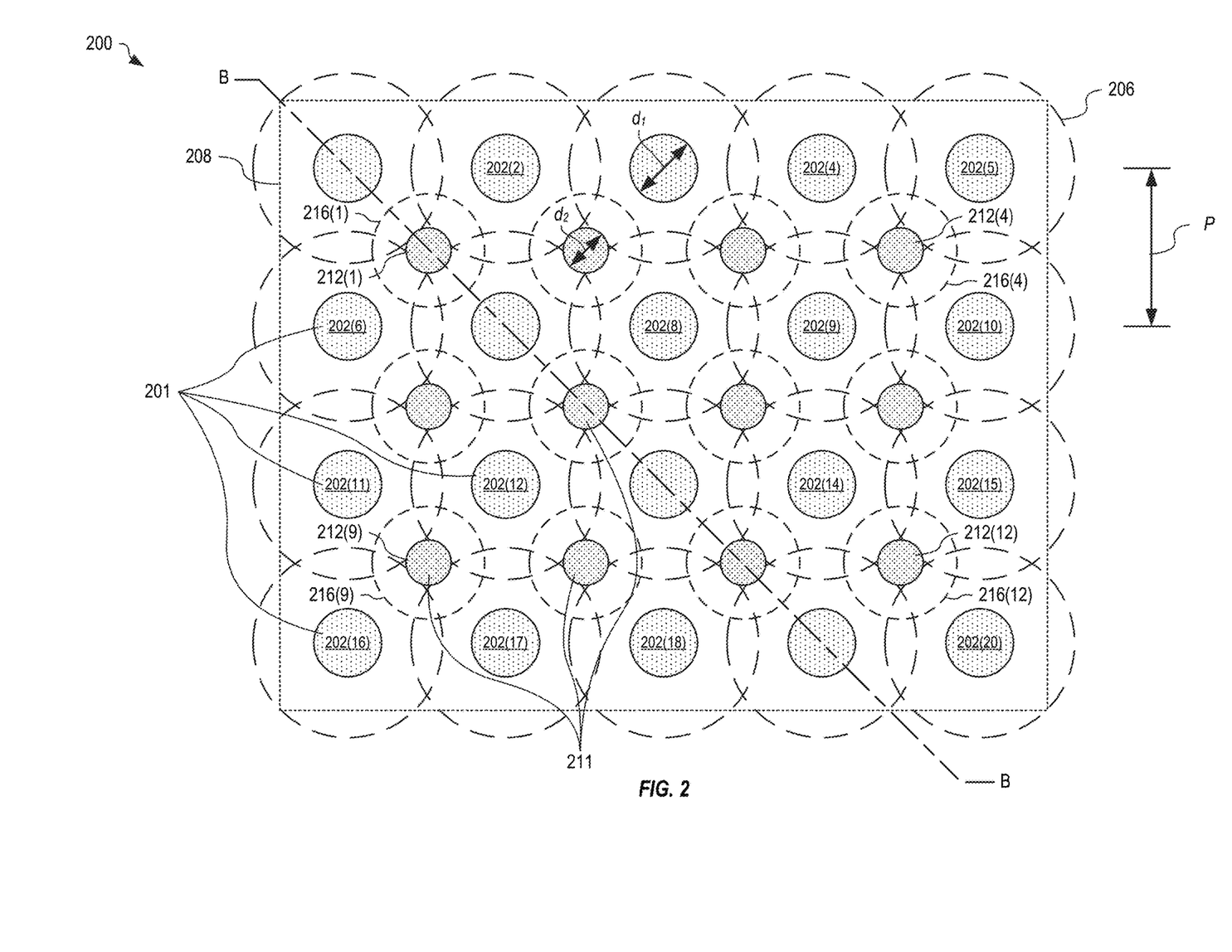
FIG. 2 is a schematic top view of one example compact camera incorporating two dissimilar ML arrays for ultra-short distance imaging, in embodiments.
Figure 3:
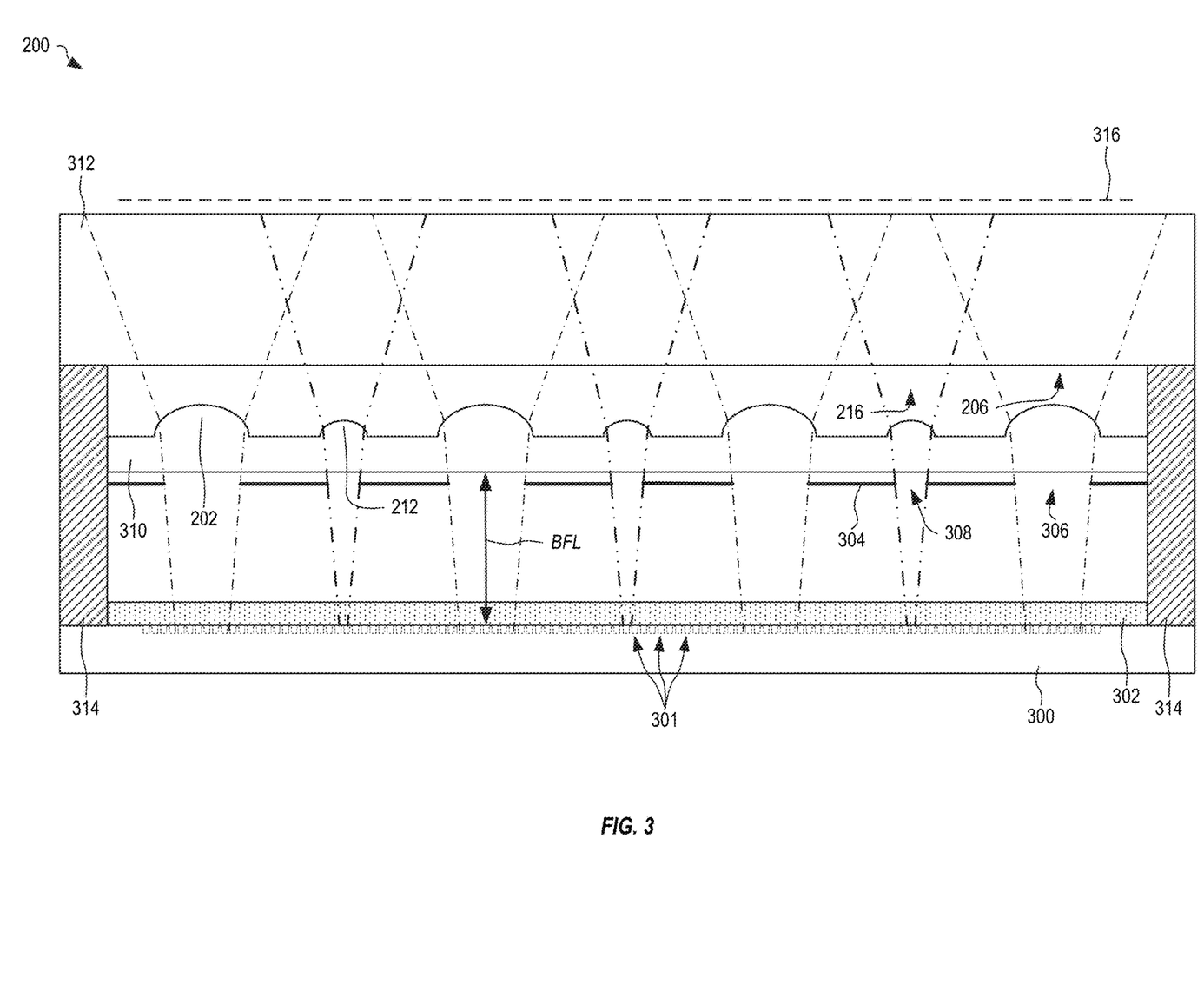
FIG. 3 is a cross-section through the compact camera of FIG. 2 illustrating an image sensor and the two dissimilar ML arrays in further example detail, in embodiments.

FIG. 2 is a schematic top view of one example compact camera 200 incorporating two dissimilar microlens (ML) arrays for ultra-short distance imaging. FIG. 3 is a cross-section B-B through compact camera 200 of FIG. 2 illustrating further example detail. FIGS. 2 and 3 are best viewed together with the following description. Not all elements are numbered for clarity of illustration.

Camera 200 includes an image sensor 300 with a plurality of pixels 301, a baffle layer 304 (e.g., an optically opaque layer) having a plurality of first sized aperture stops 306 and a plurality of second sized aperture stops 308, a ML layer 310, and a transparent layer 312 (e.g., glass) supported by side walls 314. Camera 200 may also include a filter layer 302 positioned between image sensor 300 and baffle layer 304. Filter layer 302 is positioned to filter all light impinging upon image sensor 300. In embodiments where camera 200 captures visible light, filter layer 302 is a visible-bandpass filter that only allows visible light to pass. In embodiments where camera 200 captures IR light, filter layer 302 is an IR-bandpass filter that only allows IR light to pass. Accordingly, the selection (or omission in cases where both visible and IR light are to be captured) of filter layer 302 depends on the intended application for camera 200. Visible-bandpass filters allow visible light (e.g., approximately 400-700 nm) to pass and block ultraviolet (UV) and infrared (IR) light. IR-bandpass filters allow near infrared light (e.g., approximately 700-1000 nm wavelength) to pass and block all other wavelength light (e.g., <700 nm and >1000 nm).

ML layer 310 forms (a) a first ML array 201 with a plurality of first MLs 202 each having first optical characteristics, and (b) a second ML array 211 with a plurality of second MLs 212 each having second optical characteristics that differ from the first optical characteristics. Both first ML array 201 and second ML array 211 are formed as periodic patterns (e.g., a regular square pattern with a pitch P) that are interleaved, as shown in FIG. 2. However, other patterns may be implemented without departing from the scope hereof. Each first sized aperture stop 306 is substantially aligned with a different first ML 202 and each second sized aperture stops 308 is substantially aligned with a different second ML 212. In certain embodiments, the first optical characteristics include a first diameter for first ML 202 and the second optical characteristics include a second diameter for second ML 212 that differs from the first diameter. For simplicity of illustration, first ML array 201 is shown as a five-by-four matrix and second ML array 211 is shown as a four-by-three array; however, each of first ML array 201 and second ML array 211 may have more MLs without departing from the scope hereof. In one embodiment, first ML array 201 is formed in a periodic array of M by N first MLs 202, and second ML array 211 is formed in a periodic array of P by Q second MLs 212, where P is one less than M and Q is one less than N. For example, first ML array 201 is formed in a periodic array of 14 by 10 first MLs 202, and second ML array 211 is formed in a periodic array of 13 by 9 second MLs 212. An ML may range from 50 to 250 μm in diameter and may cover 100 (=10×10) up to 10,000 (=100×100) pixels. In one embodiment, the diameters of first MLs 202 and second MLs 212 are 140 and 90 μm (micrometer) respectively. Where first ML array 201 is 14×10, with a pitch P32 600 μm, a physical size of ML layer 310, and the corresponding captured full image, is approximately 8.4×6 mm, for example.

Each first ML 202 has a respective partial FOV 206. Partial FOVs 206 overlap to collectively cover substantially all of a full FOV 208, where full FOV 208 may represent an equivalent combined FOV of camera 200. Second MLs 212 each have a smaller individual FOV 216 and are positioned to capture images with good quality at locations that are captured at a lower quality by first MLs 202. As shown, second MLs 212 are positioned such that the smaller individual FOVs 216 are at intersecting boundaries of the partial FOVs 206.

ML layer 310 may be formed of a single lens material whereby first MLs 202 and second MLs 212 are shaped to form an image of object plane 316 at an image plane of image sensor 300 and with a back focal length (BFL). The back focal length may be between 0.1 mm and 2 mm. Particularly, first MLs 202 and second MLs 212 are formed to image at least part of an object plane 316 (e.g., corresponding to the full FOV 208) at an image plane captured by pixels 301 of image sensor 300.

As shown in FIG. 2, $d_1$ is a diameter of ML 202 and $d_2$ is a diameter of ML 212. A size ratio R between $d_1$ and $d_2$ may be calculated as $d_1/d_2$. When R is less than or equal to 1.1, this size difference is basically equivalent to process tolerance. A value of R that is greater than $\sqrt{10}$ is also generally unfavorable since the captured image brightness may differ beyond an amount acceptable for generating good images using a single exposure. Accordingly, it is desirable to have R with a value between 1.1 and $\sqrt{10}$. Similarly, a suitable pitch-to-size ratio (e.g., $P/d_1$) may strike a balance between image quality and process feasibility. Accordingly, a suitable pitch-to-size ratio is between two and ten.

Figure 4A:
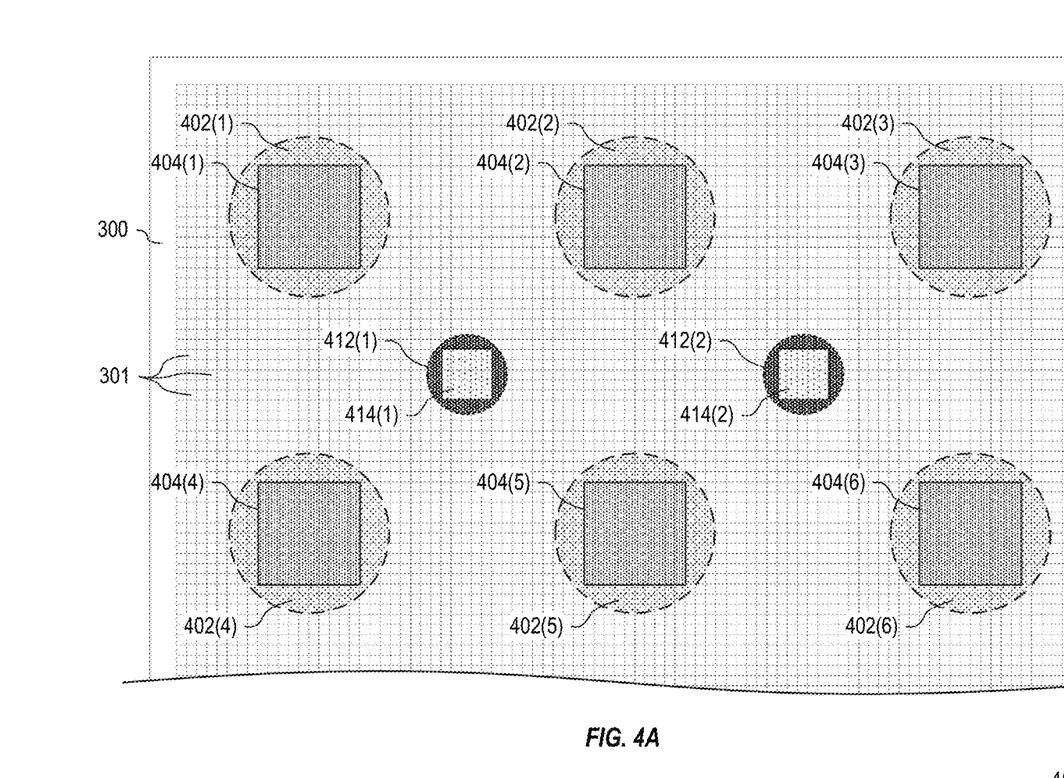
FIG. 4A is a schematic of a portion of the image sensor of FIG. 3 illustrating first image regions formed by the two dissimilar ML arrays of FIG. 2, in embodiments.

FIG. 4A is a schematic of part of image sensor 300 illustrating first image regions 402 each formed by a respective first ML 202 and second image regions 412 each formed by a respective second ML 212. Each first image region 402 has respective first active pixels 404 that capture a region of full FOV 208 imaged by the respective first ML 202. Each second image region 412 has respective second active pixels 414 that capture a portion of full FOV 208 imaged by the respective second ML 212. Each ML 202 is aligned to a respective image region 412. For example, first image region 402 is centered where the optical axis of ML 202 intersects image sensor 300. Pixels of image sensor 300 that are not allocated to any of first active pixels 404 and second active pixels 414 are unused and considered inactive.

Figure 4B:
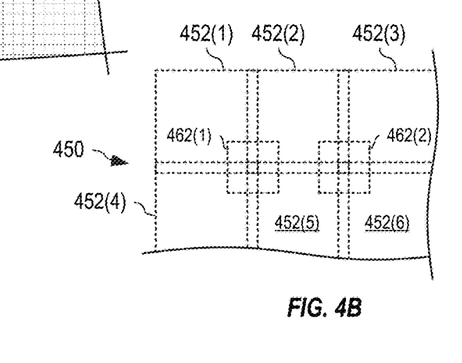
FIG. 4B shows part of one example whole image generated by stitching images from the first image regions and the second image regions together, in embodiments.

FIG. 4B shows part of one example whole image 450 generated by stitching first images 452 captured by first active pixels 404 (e.g., images formed by first ML array 201) and second images 462 captured by second active pixels 414 (e.g., images formed by second ML array 211) together such that whole image 450 has better uniformity of image quality and brightness as compared to images captured by a single ML array. Accordingly, whole image 450 is representative of an "equivalent single camera" that has the full field of view defined by boundaries of the composite image. Advantageously, by increasing the size of image sensor 300, the size of the captured full image also increases.

Figure 5:
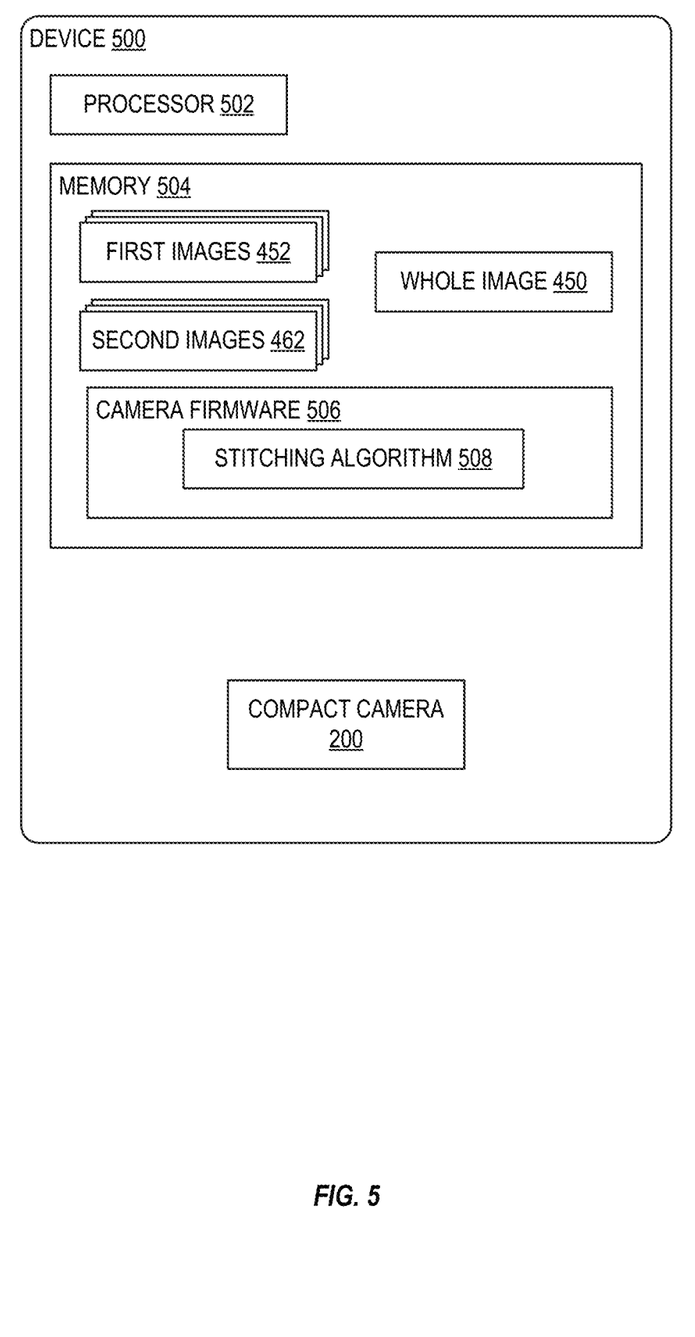
FIG. 5 shows one example device incorporating the compact camera of FIGS. 2-4, in embodiments.

FIG. 5 shows one example device 500 incorporating compact camera 200 of FIGS. 2-4. In the example of FIG. 5, device 500 is shown as a smartphone that uses compact camera 200 to capture fingerprints. However, device 500 may represent any device that has a need for compact camera 200. In certain embodiments, processor 502 and memory 504 may be incorporated with compact camera 200 to form an integrated device capable of generating whole image 450.

Device 500 includes a digital processor 502 communicatively coupled with a memory 504 (e.g., RAM, ROM, Flash, etc.) storing camera firmware 506 that includes machine-readable instructions that, when executed by processor 502, control operation of compact camera 200 to generate whole image 450 (e.g., a fingerprint image). Camera firmware 506 is shown with a stitching algorithm 508 that is invoked to stitch first images 452 and second images 462 together to form whole image 450. In one example of operation, camera firmware 506 causes processor 502 to control compact camera 200 to capture and store first images 452 and second images 462 in memory 504. Camera firmware 506 then invokes stitching algorithm 508 to process first images 452 and second images 462 and generate whole image 450.

Although shown as separate images, in certain embodiments, first images 452 and second images 462 are contained in separate parts of a single images output by image sensor 300. Accordingly, stitching algorithm 508 processes the separate parts to generate whole image 450.

Multispectral, RGB-IR, and/or HDR Imaging

The embodiments of FIGS. 2-4 may be extended for multispectral, RGB-IR, and HDR imaging. For biometric authentication such as fingerprints sensing or vein recognition, images with different spectral contents may provide additional information that is usable for anti-spoofing, and may thus enhance the security level of the biometric authentication. Reflection, transmission, and/or absorption properties of biological skin/tissues are different from spoofed (e.g., fake or non-biological) samples, particularly at different spectral bands. For example, light at longer wavelengths (such as red or infrared light) penetrate and transmit through skin/tissues better than light at shorter wavelengths (blue or green light).

Accordingly, compact camera 200 of FIGS. 2-4 may be extended for multicolor and/or multispectral imaging. By including two different color or spectral filters within aperture stops 306 and 308, each ML array 201 and 211 allows image sensor 300 to capture different spectral contents based on the respective responsivities of the filters.

Figure 6:
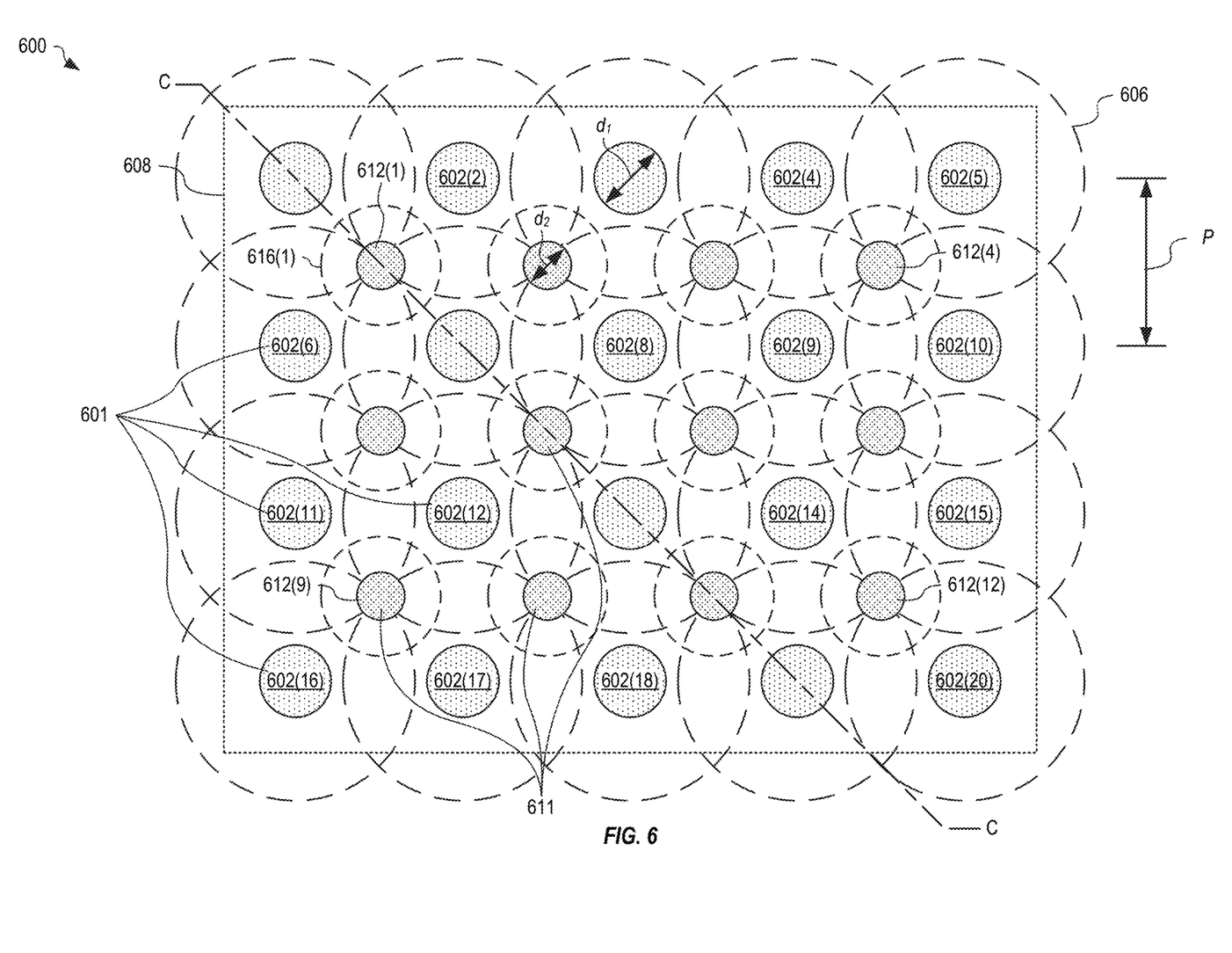
FIG. 6 is a schematic top view of one example compact camera incorporating two dissimilar ML arrays for ultra-short distance imaging, in embodiments.
Figure 7:
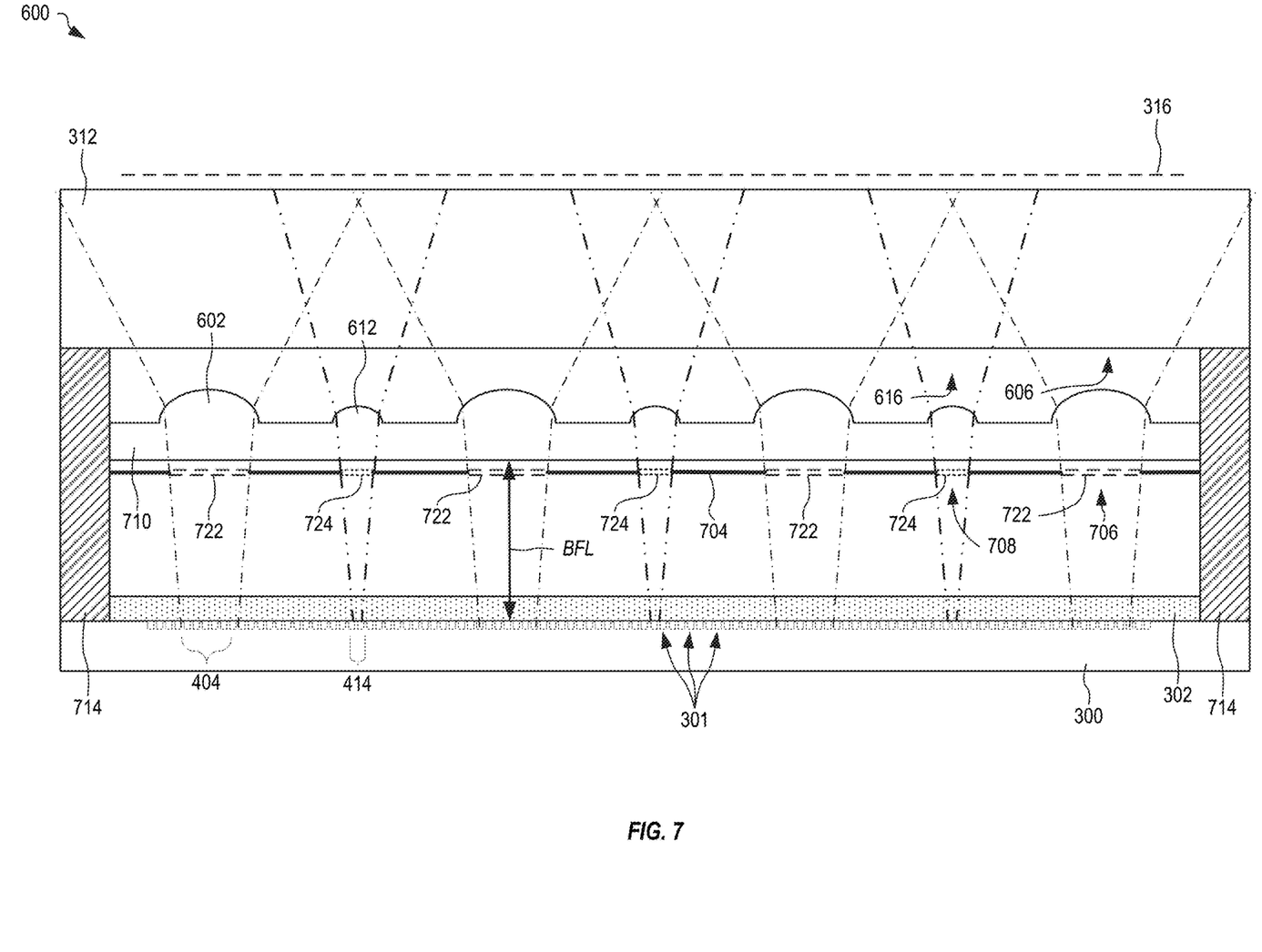
FIG. 7 is a cross-section through the compact camera of FIG. 6 illustrating included filters, in embodiments.

FIG. 6 is a schematic top view of one example compact camera 600 incorporating ML arrays for ultra-short distance imaging. FIG. 7 is a cross-section C-C through compact camera 600 of FIG. 6 illustrating included filters 722 and 724. FIGS. 6 and 7 are best viewed together with the following description. Not all elements are numbered for clarity of illustration.

Compact camera 600 is similar to compact camera 200 of FIGS. 2-4 but MLs 602 are configured such that partial FOVs 606 are wider than partial FOVs 206 such that collectively partial FOVs 606 cover substantially all of object plane 316. Further, camera 600 includes a first type of filter 722 positioned within each aperture stop 706 aligned to MLs 602 and partial FOVs 606, and a second type of filter 724 positioned within each aperture stop 708 aligned to MLs 612 and individual FOVs 616.

Camera 600 includes image sensor 300 with a plurality of pixels 301, filter layer 302 positioned above image sensor 300, a baffle layer 704 (e.g., an optically opaque layer) forming a plurality of aperture stops 706 and a plurality of aperture stops 708, an ML layer 710, and a transparent layer 312 (e.g., glass) supported by side walls 714. In certain embodiments, aperture stops 706 may be a different size from aperture stops 708. ML layer 710 forms (a) a first ML array 601 with a plurality of first MLs 602 each having first optical characteristics, and (b) a second ML array 611 with a plurality of second MLs 612 each having second optical characteristics that differ from the first optical characteristics. Both first ML array 601 and second ML array 611 are formed as regular patterns (e.g., a square pattern with a pitch P) that are interleaved, as shown in FIG. 6. However, other patterns may be implemented without departing from the scope hereof. Each aperture stop 706 is substantially aligned with a different first ML 602 and each aperture stop 708 is substantially aligned with a different second ML 612. In certain embodiments, the first optical characteristics include a first diameter of first ML 602 and the second optical characteristics include a second diameter of second ML 612 that differs from the first diameter.

Each first MLs 602 has a partial FOV 606 that overlaps with partial FOVs 606 of adjacent first MLs 602 to collectively cover substantially all of a full FOV 608, where full FOV 608 represents a FOV of camera 600. Second MLs 612 each have a smaller individual FOV 616 and are positioned to capture images with good quality at locations that are not captured at as high a quality by the first MLs 602. As shown, second MLs 612 are positioned such that the smaller individual FOVs 616 are at intersecting boundaries of the partial FOVs 606.

ML layer 710 may be formed of a single lens material whereby first MLs 602 and second MLs 612 are formed to focus an image of object plane 316 at an image plane of image sensor 300 and with a back focal length (BFL) of between 0.1 mm and 2 mm. Particularly, first MLs 602 and second MLs 612 are formed to image at least part of an object plane 316 (e.g., corresponding to the full FOV 608) at an image plane captured by pixels 301 of image sensor 300.

As shown in FIGS. 6 and 7, partial FOVs 606 overlap each other (e.g., more than partial FOVs 206), and accordingly, partial FOVs 606 collectively cover substantially all of full FOV 608 and object plane 316.

In one embodiment, filter 722 has a first transmission spectrum and filter 724 has a second transmission spectrum that differs from the first transmission spectrum. For example, filter 722 may transmit just one of red, green, and blue light while blocking the other two, while filter 724 may transmit at least one color of light that filter 722 blocks. Accordingly, compact camera 600 captures a whole image (e.g., similar to whole image 450 of FIG. 4) that includes additional spectral information when the images from partial FOVs 606 of first ML array 601 and images from individual FOVs 616 of second ML array 611 are stitched and processed together. Although the combined FOVs 616 do not cover all of object plane 316, the images captured by image areas 414, considered as "samples," provide additional spectral information that may be used to enhance images captured by image areas 404. For example, during the stitching and processing, the images captured by image areas 414 are processed with the images captured by image areas 404 to improve one or more of white balance and color temperature correction. Where compact camera 600 is used for biometric authentication, spectral information from only part of the object has been proved to be practicable for anti-spoofing. Accordingly, spectral information captured by image areas 414 may be used for anti-spoofing.

Figure 8:
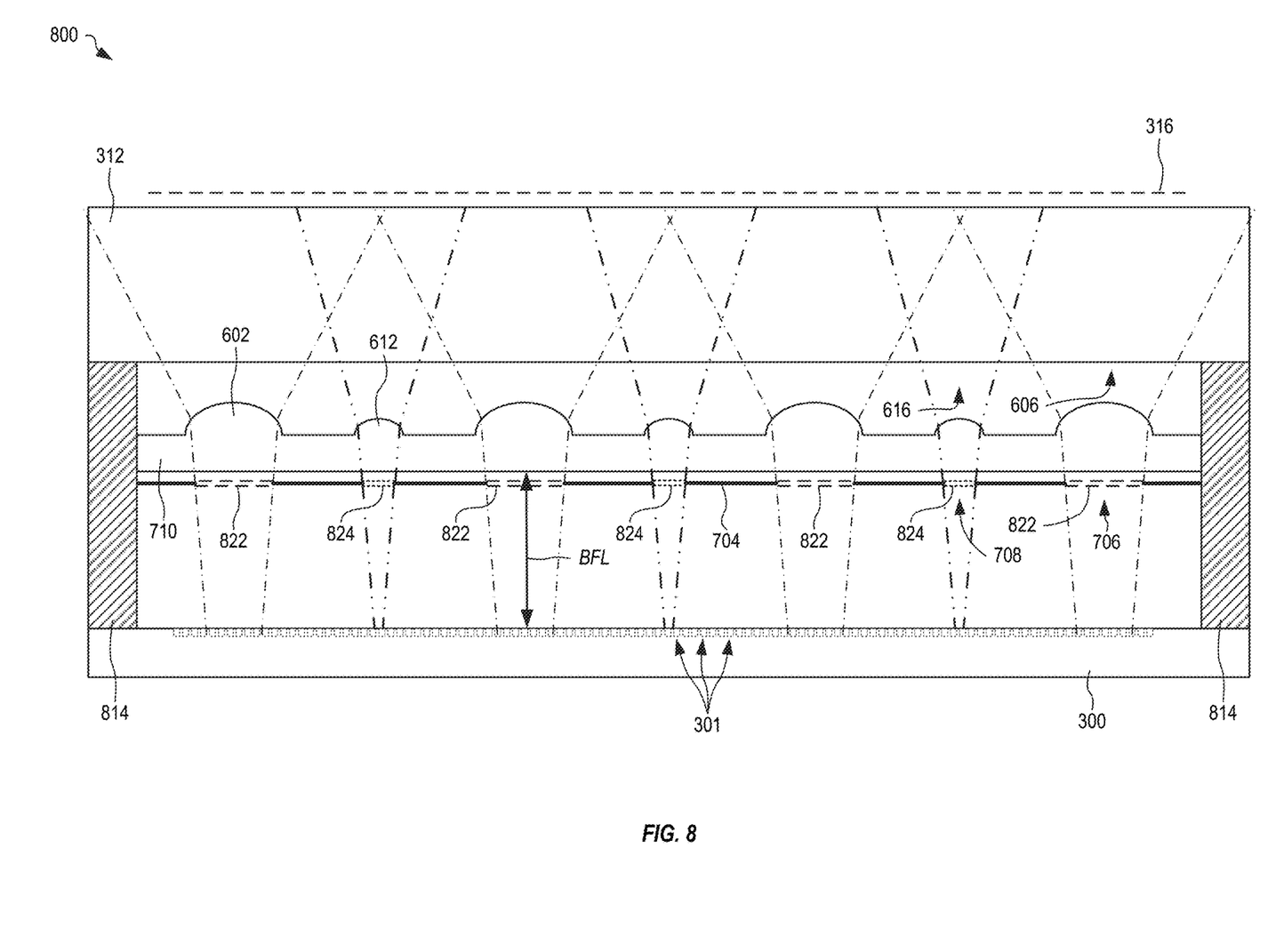
FIG. 8 is a cross-sectional view showing one example compact camera configured with visible-bandpass and infrared (IR)-bandpass filters at aperture stops corresponding to the two dissimilar ML arrays, in embodiments.

FIG. 8 is a cross-sectional view showing one example compact camera 800 configured with visible-bandpass filters and IR-bandpass filters at aperture stops corresponding to the two dissimilar ML arrays. Camera 800 is similar to camera 600 of FIGS. 6 and 7 and includes image sensor 300 with the plurality of pixels 301, baffle layer 704, ML layer 710, and transparent layer 312. Transparent layer 312 is supported by side walls 814, which are similar to side walls 314. In this embodiment, camera 800 excludes filter layer 302, since image sensor 300 is to capture both visible and IR light. A visible-bandpass filter 822 is positioned at each aperture stop 706 and an IR-bandpass filter 824 is positioned at aperture stops 708. Visible-bandpass filter 822 blocks infrared light and passes visible light, and IR-bandpass filter 824 blocks visible light and passes infrared light. Camera 800 may include a transparent adhesive layer (not shown) between image sensor 300 and ML layer 710 that bonds the ML layer 710 with image sensor 300; however, this transparent adhesive layer has negligible impact to the optical performance of camera 800.

Each of the two ML arrays 601 and 611 may be optimized for the spectra passed by their corresponding filters 822 and 824. For example, first MLs 602 are formed to create an image of object plane 316 at the image plane of image sensor 300 at visible wavelengths, whereas second MLs 612 are formed to create an image of object plane 316 at the image plane of image sensor 300 at infrared wavelengths. As with camera 600, first MLs 602 and second MLs 612 have the same back focal length (BFL) at wavelengths transmitted by filters 822 and 824 respectively.

Accordingly, compact camera 800 captures a whole image (e.g., similar to whole image 450 of FIG. 4) that includes additional spectral information when the images from partial FOVs 606 of first ML array 601 and images from individual FOVs 616 of second ML array 611 are captured and stitched together to form an image with greater spectral range. In certain embodiments, first ML array 601 and second ML array 611 are designed and fabricated to allow two separate images to be generated, each with different spectral content. In these embodiments, first ML array 601 and second ML array 611 have different characteristics and may be designed and optimized for different spectral ranges. In embodiments, FOVs 606 do not overlap, since certain applications do not require such overlap. Advantageously, as discussed above, RGB-IR images benefit the anti-spoofing applications where camera 800 is used for biometric authentication.

Figure 9:
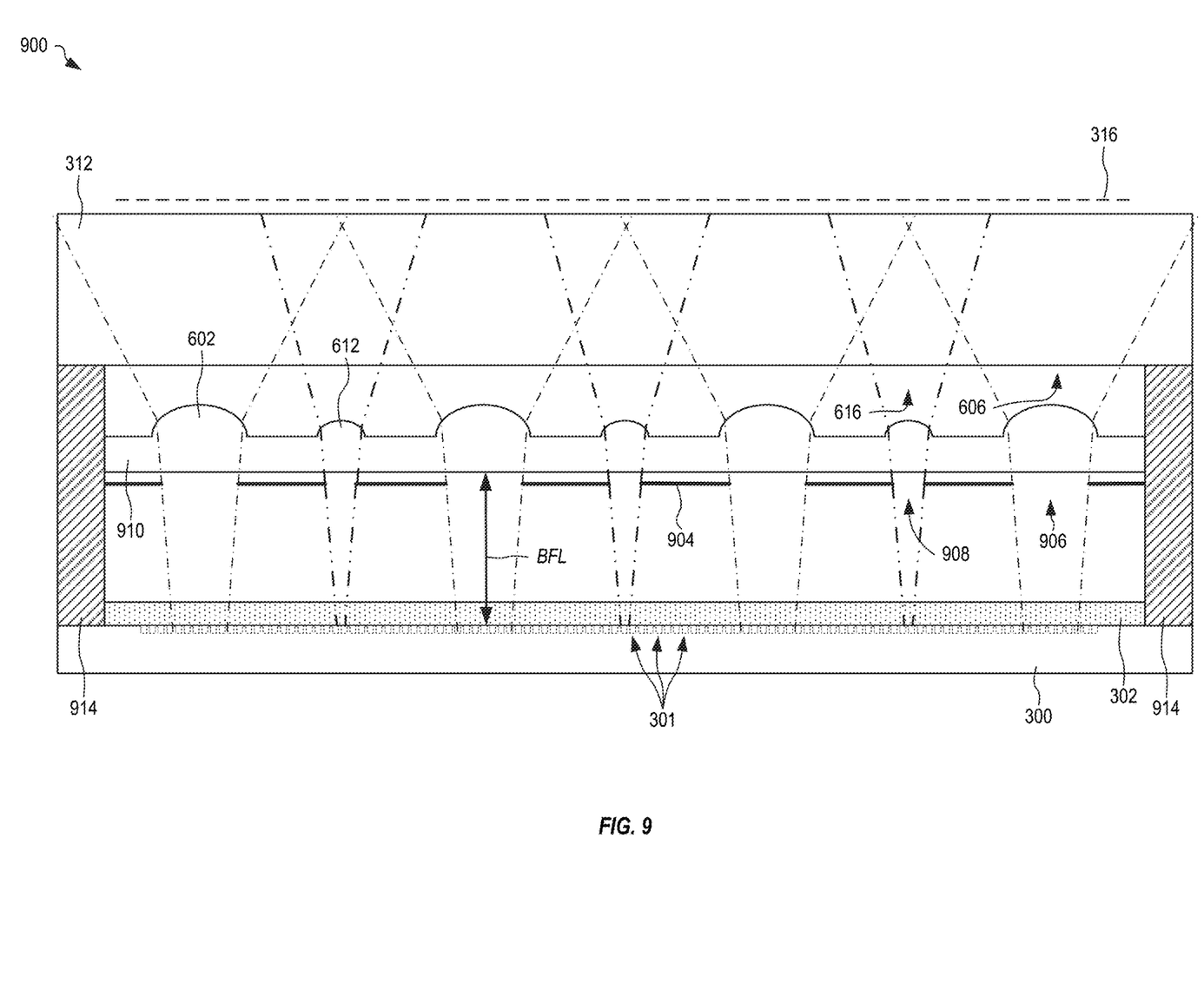
FIG. 9 is a cross-sectional view showing one example compact camera with dissimilar ML arrays configured for high dynamic range (HDR) imaging, in embodiments.

FIG. 9 is a cross-sectional view showing one example compact camera 900 with dissimilar ML arrays configured for high dynamic range (HDR) imaging. Camera 900 includes image sensor 300 with the plurality of pixels 301, a baffle layer 904 forming a plurality of aperture stops 906 and a plurality of aperture stops 908, an ML layer 910, and transparent layer 312 supported by side walls 914. Camera 900 may also include filter layer 302. ML layer 910 is similar to ML layer 710 of FIG. 7 and, as shown in FIG. 6, forms (a) a first ML array 601 with a plurality of first MLs 602 each having first optical characteristics, and (b) a second ML array 611 with a plurality of second MLs 612 each having second optical characteristics, different from the first optical characteristics. In this embodiment, the two ML arrays 601 and 611 and/or baffle layer 904 are designed to have different light collection qualities, such as having different f-number. As with camera 600, first MLs 602 and second MLs 612 have the same back focal length (BFL).

Accordingly, compact camera 800 captures a whole image (e.g., similar to whole image 450 of FIG. 4) that has a higher dynamic range when the images from partial FOVs 606 of first ML array 601 and images from individual FOVs 616 of second ML array 611 are stitched together. Advantageously, HDR images enhance the signal-to-noise ratio of biometric images captured under certain circumstances such as strong lighting or with cold or wet fingers, when normally captured images would have low contrast.

Simplified Process Flow

Figure 10:
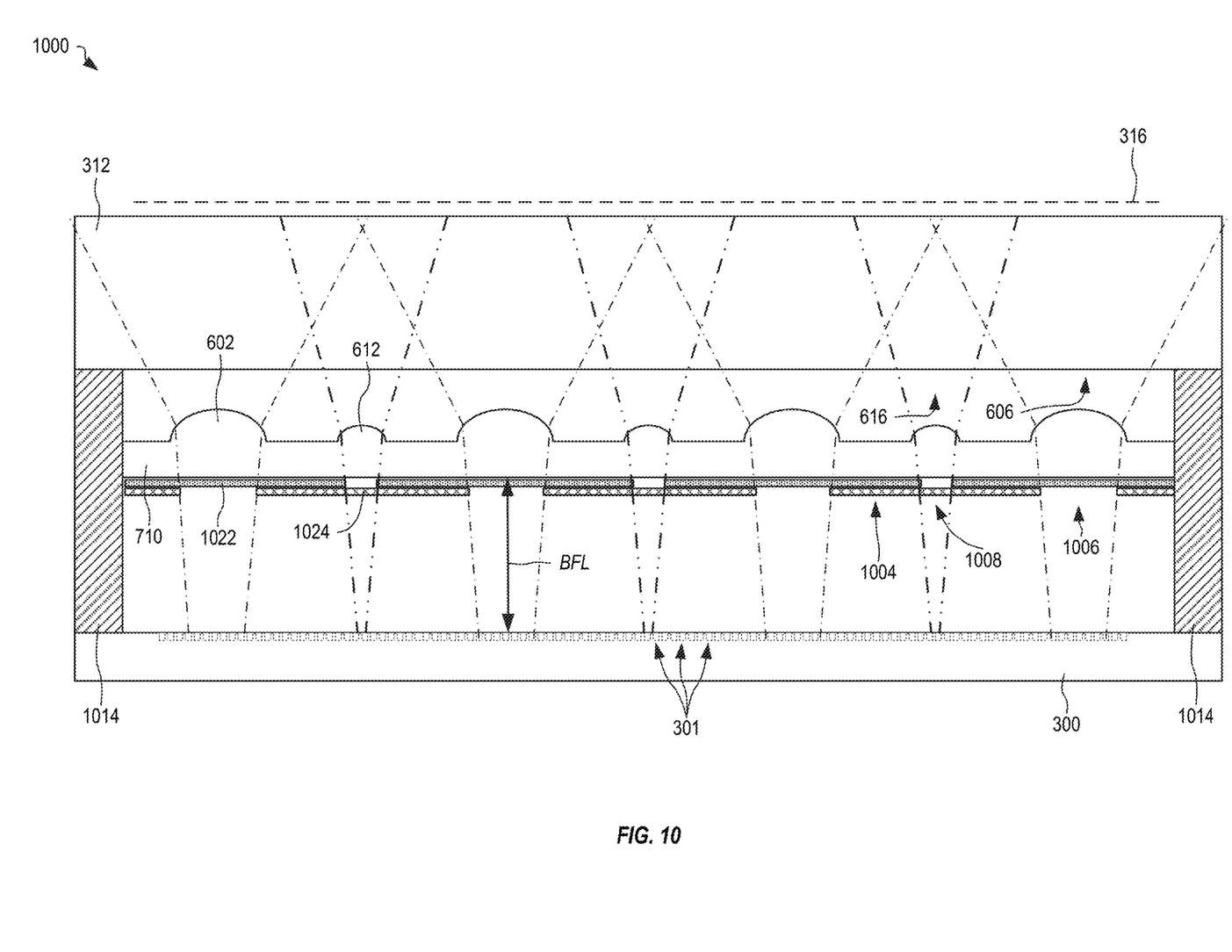
FIG. 10 is a cross-sectional view showing one example compact camera with two dissimilar ML arrays and a baffle layer formed of a visible-bandpass filter and an IR-bandpass filter cascaded in two layers, in embodiments.

FIG. 10 is a cross-sectional view showing one example compact camera 1000 with two dissimilar ML arrays for capturing both visible and infrared wavelengths using a baffle layer 1004 formed of two cascaded filter layers. Camera 1000 is similar to camera 800 of FIG. 8 and includes image sensor 300 with the plurality of pixels 301, a baffle layer 1004, ML layer 710, and transparent layer 312 supported by side walls 1014. Camera 1000 may include a transparent adhesive layer (not shown) that bonds the ML layer 710 with image sensor 300; however, this transparent adhesive layer has negligible impact to the optical performance of camera 1000.

In the embodiment of FIG. 10, baffle layer 1004 is not a single optically opaque layer with apertures. Instead, baffle layer 1004 is formed using two different layers: a visible-bandpass filter layer 1022 (e.g., formed of a visible-bandpass filter material for blocking wavelengths between 400 nm and 675 nm) and an IR-bandpass filter layer 1024 (e.g., formed of an IR-bandpass filter material blocking visible light and allowing wavelengths above 700 nm to pass). Visible-bandpass filter layer 1022 forms a plurality of partial-band aperture stops 1008 that are each aligned with a different one of MLs 612. IR-bandpass filter layer 1024 forms a plurality of partial-band aperture stops 1006 that are each aligned with a different one of MLs 602. Accordingly, only visible-bandpass filter layer 1022 is present within partial-band aperture stops 1006, which have transmissivity of the visible-bandpass filter material, and only IR-bandpass filter layer 1024 is present within partial-band aperture stops 1008, which have transmissivity of the IR-bandpass filter material. Where both layers 1022 and 1024 are present (e.g., between partial-band aperture stops 1006 and 1008), visible-bandpass filter layer 1022 and IR-bandpass filter layer 1024 are cascaded and effectively form an optically opaque layer that blocks all light at wavelengths detectable by image sensor 300. Advantageously, the manufacturing process for camera 1000 is simplified since no separate layer is required to block all light.

Figure 11A:
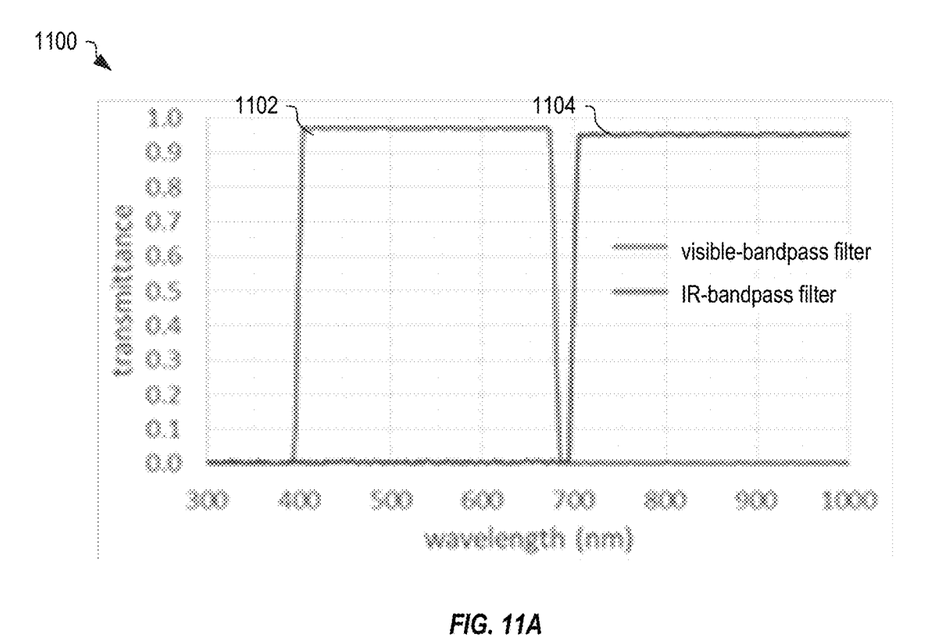
FIG. 11A is a graph illustrating example transmittance spectra of the visible-bandpass filter and the IR-bandpass filter of FIG. 10, in embodiments.
Figure 11B:
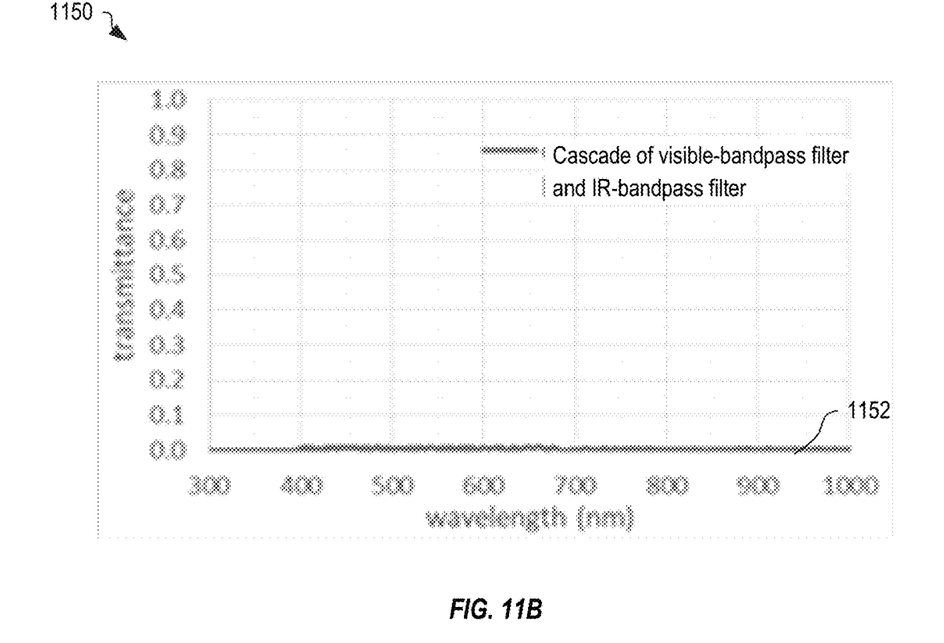
FIG. 11B is a graph illustrating example transmittance spectrum of the visible-bandpass filter cascaded with the IR-bandpass filter of FIG. 10, in embodiments.

FIG. 11A is a graph 1100 illustrating example transmittance spectrum of visible-bandpass filter layer 1022 (indicated by line 1102) and IR-bandpass filter layer 1024 (indicated by line 1104). FIG. 11B is a graph 1150 illustrating example transmittance spectra of visible-bandpass filter layer 1022 cascaded with IR-bandpass filter layer 1024 (indicated by line 1152).

Figure 12:
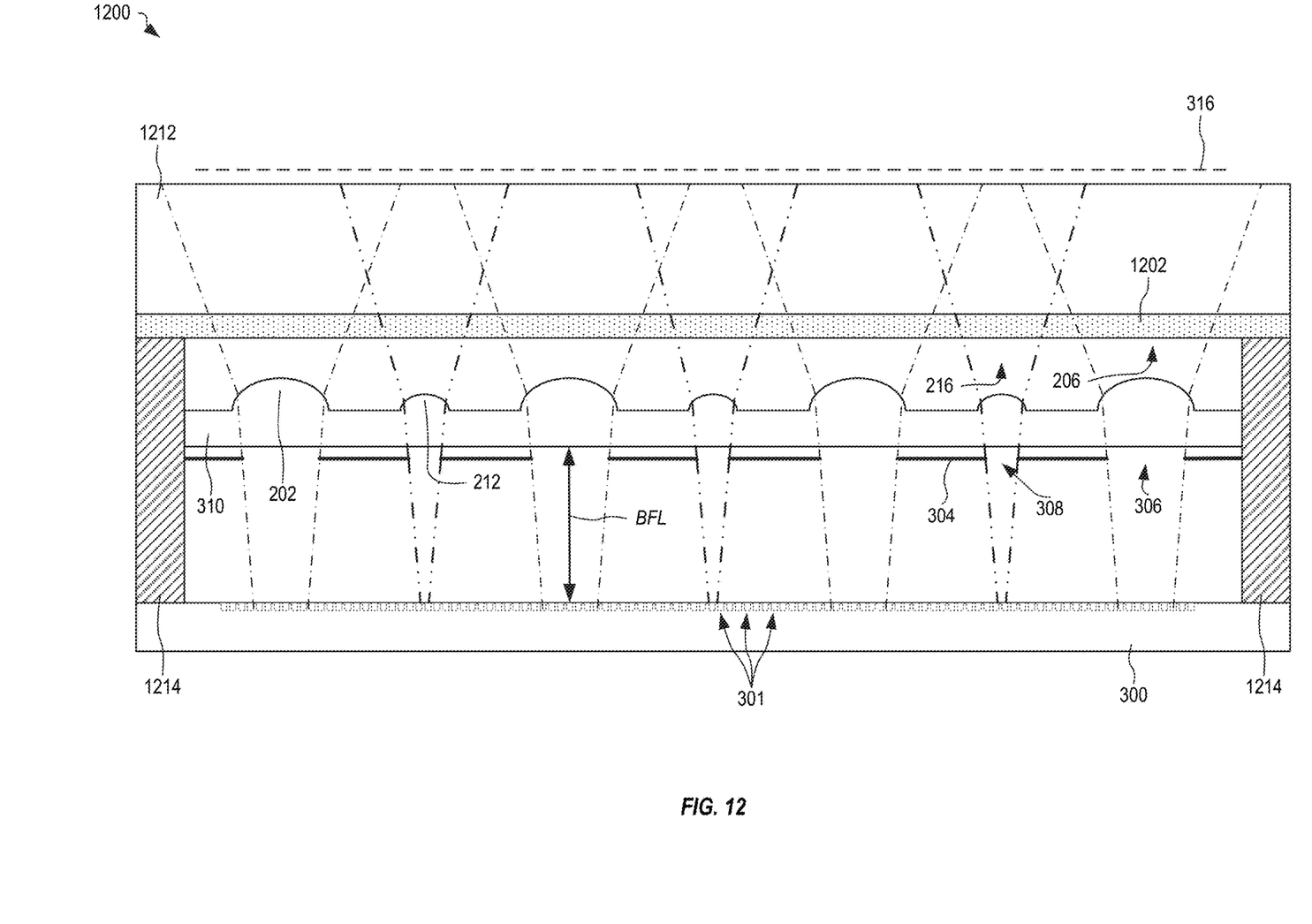
FIG. 12 is a cross-sectional view showing one example compact camera with two dissimilar ML arrays and a repositioned filter, in embodiments.

FIG. 12 is a cross-sectional view showing one example compact camera 1200 with two dissimilar ML arrays and a repositioned filter 1202. Camera 1200 is similar to camera 200 of FIGS. 2 and 3 and includes image sensor 300 with the plurality of pixels 301, filter 1202, baffle layer 304 having the plurality of first sized aperture stops 306 and the plurality of second sized aperture stops 308, ML layer 310, and a transparent layer 1212 supported by side walls 1214.

Unlike compact camera 200, where filter layer 302 is formed (e.g., directly deposited) onto image sensor 300, in compact camera 1200, filter 1202 is deposited onto a lower surface of transparent layer 1212. Advantageously, this may reduce the cost of manufacture of camera 1200 since difficult filter coating of image sensor 300 is avoided, which may prevent yield loss. Camera 1200 may include a transparent adhesive layer (not shown) above pixels 301 that bonds the MLA and its supporting layer with image sensor 300; however, this transparent adhesive layer has negligible impact to the optical performance of camera 1200.

Summary of Advantages

The embodiments described herein have several advantages over the prior art. For example, compact cameras 200, 600, 800, 900, 1000, and 1200 of FIGS. 2, 6, 8, 9, 10, and 12, respectively, are module with a low profile that is reflowable. Compact cameras 200, 600, 800, 900, 1000, and 1200 have uniformity of image quality and brightness across the whole FOV that is greatly improved over the prior art. Compact cameras 200, 600, 800, 900, 1000, and 1200 allow wafer-level assembly for cost-effective mass production. The concept of utilizing dissimilar MLAs is extended to multicolor, RGB-IR, and HDR imaging whereby compact cameras 200, 600, 800, 900, 1000, and 1200 capture images with different spectral contents simultaneously and offer data for anti-spoofing use in biometric authentication such as optical fingerprints or veins recognition.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A compact camera for ultra-short distance imaging, comprising:
   an image sensor;
   a transparent layer;
   a microlens (ML) layer, between the image sensor and the transparent layer, forming (a) a first ML array having a plurality of first MLs, and (b) a second ML array with a plurality of second MLs interleaved with the plurality of first MLs;
   a baffle layer, between the ML layer and the image sensor, forming a plurality of first aperture stops each aligned with a different one of the first MLs and a plurality of second aperture stops each aligned with a different one of the second MLs; and
   each first ML of the plurality of first MLs having a first set of optical characteristics including a diameter $d_1$, and each second ML of the plurality of second MLs having a second set of optical characteristics that differs from the first set of optical characteristics;
   the first ML array having a pitch P, wherein $2<P/d_1<10$.

2. The compact camera of claim 1, further comprising a filter layer positioned between the baffle layer and the image sensor.

3. The compact camera of claim 1, further comprising a filter layer positioned between the ML layer and the transparent layer.

4. The compact camera of claim 1, wherein the first ML array and the second ML array each form a periodic pattern.

5. The compact camera of claim 4, the periodic pattern being a square pattern.

6. The compact camera of claim 1, each first ML having a diameter $d_1$ and each second ML having a diameter $d_2$, where $d_1$ greater than $d_2$, and a ratio $R=d_1/d_2$, wherein $1.1<R<\sqrt{10}$.

7. The compact camera of claim 1, wherein the ML layer is formed of a single lens material and the first MLs and the second MLs having a back focal length (BFL) greater-than or equal to 0.1 mm and less-than 2 mm.

8. A compact camera for ultra-short distance imaging, comprising:
   an image sensor;
   a transparent layer;
   a microlens (ML) layer, between the image sensor and the transparent layer, forming (a) a first ML array having a plurality of first MLs, and (b) a second ML array with a plurality of second MLs interleaved with the plurality of first MLs;
   a baffle layer, between the ML layer and the image sensor, forming a plurality of first aperture stops each aligned with a different one of the first MLs and a plurality of second aperture stops each aligned with a different one of the second MLs;
   each first ML of the plurality of first MLs (i) being directly above multiple pixels of the image sensor and (ii) having a first set of optical characteristics; and
   each second ML of the plurality of second MLs (i) being directly above multiple pixels of the image sensor and (ii) having a second set of optical characteristics that differs from the first set of optical characteristics;
   wherein each of the first MLs is positioned to form first images on respective first regions of the image sensor and each of the second MLs is positioned to form second images on respective second regions of the image sensor different from the first regions.

9. The compact camera of claim 8, further comprising a plurality of first color filters each formed in a respective one of the first aperture stops, and a plurality of second color filters each formed in a respective one of the second aperture stops.

10. The compact camera of claim 9, further comprising:
    a processor; and
    a memory storing a stitching algorithm having machine-readable instructions that, when executed by the processor, stitch the first images and the second images together to form a full image with higher spectral range.

11. The compact camera of claim 8, further comprising a plurality of visible- bandpass filters each formed in a different one of the first aperture stops, and a plurality of IR-bandpass filters each formed in a different one of the second aperture stops.

12. The compact camera of claim 8, wherein a difference between the first set of optical characteristics and the second set of optical characteristics includes a difference in f-number.

13. The compact camera of claim 1, the baffle layer comprising:
    a visible-bandpass filter layer forming the plurality of second aperture stops; and
    an IR-bandpass filter layer forming the plurality of first aperture stops.

14. The compact camera of claim 13, each of the plurality of first aperture stops having a transmissivity of the visible-bandpass filter layer and each of the plurality of second aperture stops having a transmissivity of the IR-bandpass filter layer.

15. A method for ultra-short distance imaging, comprising:
    forming, at each of a plurality of first regions of an image sensor, a respective one of a plurality of first images;
    forming, at each of a plurality of second regions of the image sensor, a respective one of a plurality of second images;
    capturing the plurality of first images and the plurality of second images using the image sensor; and
    stitching the captured plurality of first images and the captured plurality of second images together to form an image of a scene; wherein:
    forming each of the plurality of first images includes imaging, with a respective one of a plurality of first microlenses of a first microlens array, a respective one of a plurality of first scene-regions of the scene, each of the first microlenses having a first set of optical characteristics;

forming each of the plurality of second images includes imaging, with a respective one of a plurality of second microlenses of a second microlens array, a respective one of a plurality of second scene-regions of the scene, each of the plurality of second microlenses having a second set of optical characteristics that differs from the first set of optical characteristics; and the plurality of second microlenses is interleaved with the plurality of first microlenses.

16. The method of claim 15, the step of forming the plurality of first images comprising forming a first periodic array of the plurality of first images and the step of forming the plurality of second images comprising forming a second periodic array of the plurality of second images.

17. The method of claim 15, wherein a difference between the first set of optical characteristics and the second set of optical characteristics is an ML diameter.

18. The method of claim 15, wherein a difference between the first set of optical characteristics and the second set of optical characteristics includes a difference in f-number.

19. The method of claim 15, each first microlens of the plurality of first microlenses having a diameter $d_1$, the first microlens array having a pitch P, wherein $2<P/d_1<10$.

20. The method of claim 15,
each first microlens of the plurality of first microlenses being directly above multiple pixels of the image sensor; and
each second microlens of the plurality of second microlenses being directly above multiple pixels of the image sensor.

* * * * *